(12) United States Patent
Chen

(10) Patent No.: US 6,331,463 B1
(45) Date of Patent: Dec. 18, 2001

(54) METHOD FOR MANUFACTURING LOW POWER HIGH EFFICIENCY NON-VOLATILE ERASABLE PROGRAMMABLE MEMORY CELL STRUCTURE

(75) Inventor: Shen-Li Chen, Taichung (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/233,375

(22) Filed: Jan. 18, 1999

(51) Int. Cl.⁷ ................................................. H01L 21/336
(52) U.S. Cl. ................................................. 438/257; 438/593
(58) Field of Search ........................ 438/257, 407, 438/514, 585, 593, 594

(56) References Cited

U.S. PATENT DOCUMENTS

| | | | |
|---|---|---|---|
| 4,849,248 | 7/1989 | Hashimoto | 427/38 |
| 5,640,345 | 6/1997 | Okuda et al. | 257/640 |
| 5,714,766 | * 2/1998 | Chen et al. | 257/17 |
| 5,999,444 | 12/1999 | Fujiwara et al. | 365/185.02 |
| 6,005,270 | 12/1999 | Noguchi | 257/315 |
| 6,011,725 | 1/2000 | Eitan | 365/185.33 |

* cited by examiner

Primary Examiner—Sara Crane
(74) Attorney, Agent, or Firm—Blakely Sokoloff Taylor & Zafman

(57) ABSTRACT

A low power high efficiency non-volatile erasable programmable memory cell structure has a characteristic, distributed, floating gate structure comprising an assembly of independent crystalline silicon crystals. Each crystalline silicon crystal has a diameter of roughly between 10 Å and 100 Å and is separated from the other crystals by a distance greater than 50 Å.

26 Claims, 7 Drawing Sheets

METHOD FOR MANUFACTURING LOW POWER HIGH EFFICIENCY NON-VOLATILE ERASABLE PROGRAMMABLE MEMORY CELL STRUCTURE

BACKGROUND OF THE INVENTION

1. Field of Invention

The present invention relates to a type of non-volatile memory. More particularly, the present invention relates to a type of non-volatile memory cell capable of working at a low power but having a high efficiency.

2. Description of Related Art

Most erasable programmable read-only-memory (EPROM), electrically erasable programmable read-only-memory (EEPROM) and flash memory all have similar structures that resemble the one shown in FIG. 1. These memories typically include a control gate 103 and a channel 101 with a floating gate 102 sandwiched between the two. The floating gate 102 is a conductive layer normally fabricated using polysilicon material. The floating gate layer 102 is a continuous thin film having a thickness of about 1200 Å, and is generally formed using a chemical vapor deposition process. The floating gate 102 is an electrically isolated structure not attached to any electrodes or power source and is generally surrounded by insulation material. Data can be written into the memory by injection hot electrons through the channel 101 or the substrate 100 into the floating gate layer 102. The flow of hot electrons can be reversed sending the trapped electrons out of the floating gate layer 102 to erase the stored data.

The method of writing data into a non-volatile EPROM cell in general includes setting up an electric field across a $Si/SiO_2$ barrier layer to attract channel electrons or supplying to the electrons with enough energy to overcome the barrier. Consequently, the threshold voltage of the memory cell is increased. The variation of threshold voltage caused by the change in stored electric charges within the floating gate layer 102 can represent a logic state of "0" and "1", respectively. To erase stored data from an EPROM cell, a high electric field is set up between the source terminal 104 and the gate control 103 (source terminal being positive) with the drain terminal disconnected from any voltage source.

Therefore, electric trapped charges in the floating gate layer 102 can now penetrate a neighboring barrier layer, and so the electric charges are removed. After the removal of electric charges within the floating gate 102, threshold voltage of the transistor inside the memory cell unit drops. In normal circumstances, data charges leaking from the floating gate 102 to the source region 104, the drain region 105 and the substrate 100, respectively, must be prevented for the correct reading of data and for long data retention period. One consequence is that the tunneling oxide layer 106 must not be too thin. Otherwise, the electric trapped charges can easily leak away.

On the other hand, having a thick tunneling oxide layer 106 is not altogether beneficial to the operation of the memory, either. This is because a higher writing or erasing voltage must be supplied to the hot electrons in the channel before the electrons can jump across the barrier layer between the floating gate 102 and the channel. The higher voltage not only consumes more electric power, and degradation caused by the hot carriers within the tunneling oxide layer 106 may also occur, as well.

As dimensions of memory devices continue to shrink, thickness of the tunneling oxide layer has to be reduced correspondingly. On the positive side, having a thinner tunneling oxide layer increases data writing and erasing efficiency as well as speed. However, a thin tunneling oxide layer can easily result in the breakdown of the oxide layer. In other words, the oxide layer can be damaged by energetic carriers leading to an increase in leakage current from the floating gate. Furthermore, the leakage current can act in reverse to prevent the flow of electrons into the floating gate in a memory-write operation. Consequently, memory-write operations may take longer. Subjected to correct data reading and data retention constraints, the tunneling oxide layer preferably has a thickness of more than 70 Å.

In light of the foregoing, there is a need to improve the power consumption, efficiency, reading accuracy and data retention period of a non-volatile EPROM cell.

SUMMARY OF THE INVENTION

Accordingly, the present invention provides a non-volatile EPROM cell that provides a low power consumption but still has a high operating efficiency.

Another aspect of this invention is to provide a non-volatile EPROM cell capable of writing into and erasing data from the memory faster, and that accuracy of data reading operations is higher and the data retention period is longer.

To achieve these and other advantages and in accordance with the purpose of the invention, as embodied and broadly described herein, the invention provides a low power, high efficiency, non-volatile, EPROM cell structure. The structure includes a floating gate composed of an assembly of distributed independent floating gates. In fact, each floating gate is a small crystalline silicon crystal. Each crystalline silicon crystal is surrounded by a layer of insulating material with each independent crystalline crystal having a diameter ranging from 10 Å to 100 Å. These small crystals are separated from each other by a distance of greater than about 50 Å.

To achieve further advantages and in accordance with the purpose of the invention, a method for manufacturing a low power, high efficiency, non-volatile EPROM cell is provided. The method includes the steps of first forming a thin thermal oxide layer over a silicon substrate. Thereafter, a silicon nitride layer is formed over the thin thermal oxide layer, and then an ion implantation operation is carried out to implant silicon ions into the silicon nitride layer. Next, a dielectric layer is formed over the silicon nitride layer, and then a second polysilicon gate layer is formed over the dielectric layer. In the subsequent step, the second polysilicon gate layer, the dielectric layer, the silicon nitride layer and the thin thermal oxide layer are etched in sequence to form a pattern. Finally, another ion implantation is carried out to from a source region and a drain region in the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
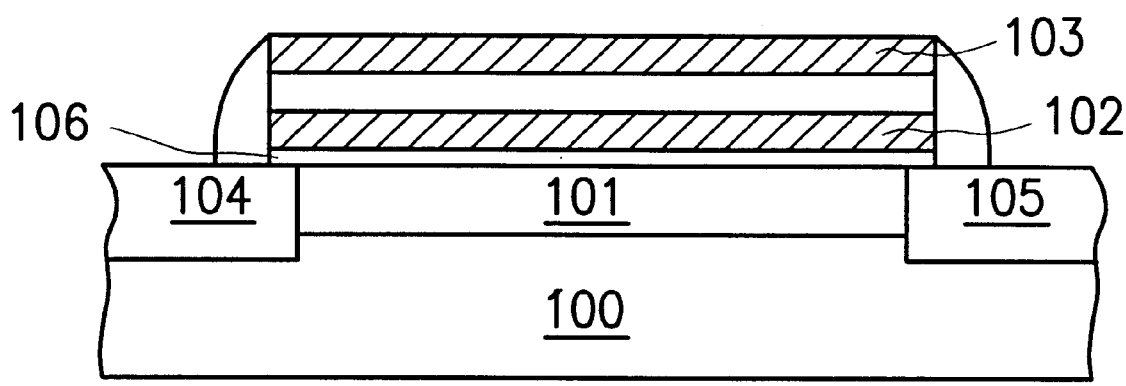
FIG. 1 is a schematic, cross-sectional view showing a conventional non-volatile EPROM cell structure.

Reference now be made in detail to the present preferred embodiments of the invention, examples of which are illustrated in the accompanying drawings. Wherever possible, the same reference numbers are used in the drawings and the description to refer to the same or like parts.

Figure 2:
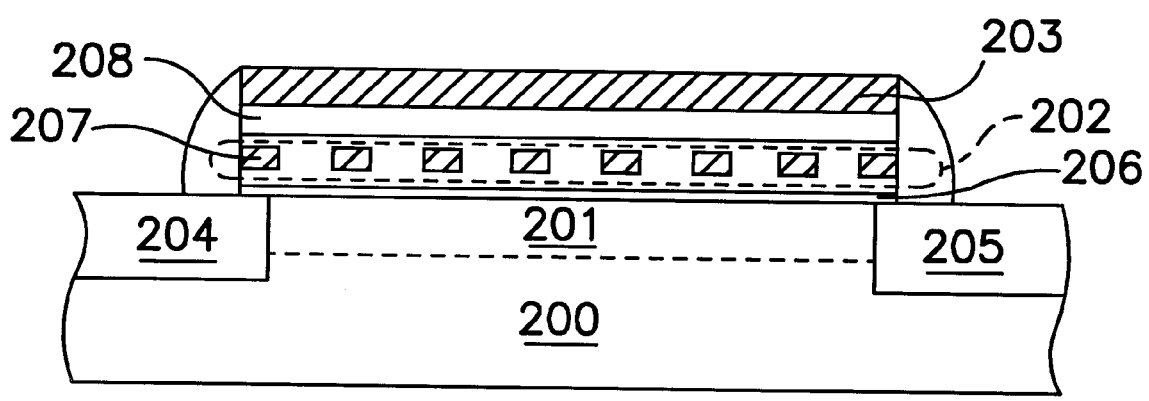
FIG. 2 is a schematic, cross-sectional view showing a non-volatile EPROM cell structure according to one preferred embodiment of this invention.

FIG. 2 is a cross-sectional view showing a non-volatile EPROM cell structure according to one preferred embodiment of this invention. The special, distributed floating gate design is capable of increasing efficiency in writing and erasing operations, lowering required operating voltage (lowering power consumption), improving data retention period and preventing damages in the tunneling oxide layer. The memory cell of the invention includes a dual gate field effect transistor (FET) structure.

A bias voltage is applied to an upper gate electrode commonly known as a control gate 203. The lower gate electrode, commonly known as a floating gate 202, is not connected to any electrode or voltage source. Structurally, the floating gate 202 is formed between a channel 201 and the control gate 203, and is separated from the channel 201 by a distance of between about 10 Å and 50 Å. The floating gate 202 comprises many independent small crystalline silicon crystals 207 (having a diameter between 10 Å to 100 Å), separated from each other by a distance of roughly 50 Å. With the distributed floating gate design, stored electric charges cannot easily hop from one crystalline silicon crystal 207 to the next, because to do so they would have to overcome the $Si/SiO_2$ barrier. Hence, leakage of electric charges horizontally to the source terminal 204, the drain region 205 or the substrate 200 is prevented.

Therefore, the non-volatile EPROM cell structure of this invention includes a distributed floated gate structure 202. The distributed gate structure 202 has many independent small crystalline silicon crystals 207, each having a diameter ranging between 10 Å to 100 Å. Furthermore, the small crystalline silicon crystals 207 are separated from each other by a distance roughly greater than 50 Å as shown in FIG. 2. In addition, the memory cell structure of this invention is fabricated on a substrate 200 including a source terminal 204 and a drain terminal 205 near the substrate surface, a control gate 203 with suitable bias voltage, a channel 201 between the source terminal 204 and the drain terminal 205, a tunneling oxide layer 206 above the channel 201, a distributed floating gate structure 202 above the tunneling oxide layer 206, an insulation layer 208 above the distributed floating gate structure 202, and a control gate 203 above the insulation layer 208.

Figure 3:
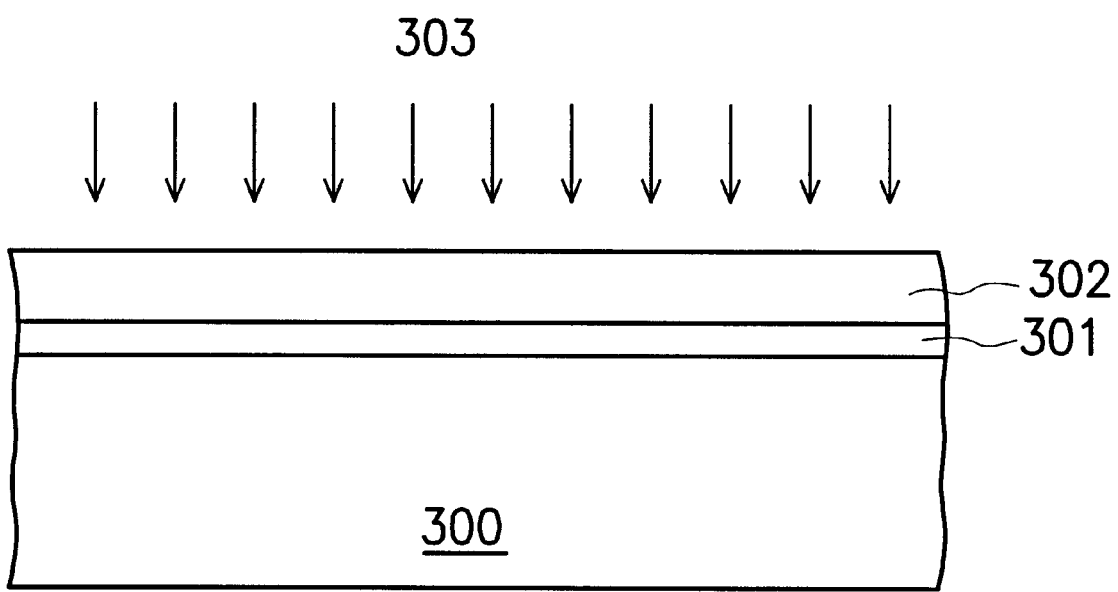
FIG. 3 is a schematic, cross-sectional view showing the process of implanting silicon ions into a silicon nitride layer according to the preferred embodiment of this invention.

The distributed floating gate structure 202 is formed by a silicon ion implantation. By adjusting the implantation dosage and the accelerated energy of the ions, the number of silicon ions penetrating a silicon nitride ($Si_3N_4$) layer to reach a thin thermal oxide layer (also known as a tunneling oxide layer) is carefully controlled. Since silicon ions must not penetrate into the silicon substrate, thickness of the tunneling oxide layer has to be controlled within the range of 10 Å to 50 Å. The silicon ions 303 are permitted to penetrate through the silicon nitride layer 302 to reach the thin thermal oxide layer 301 as shown in FIG. 3. Here, silicon ions are implanted into the silicon nitride layer 302 and the thin thermal oxide layer instead of a thermal oxide layer having an equivalent thickness. This is because a silicon nitride layer is better able to control the thickness of the floating gate and the tunneling oxide layer illustrated in FIGS. 4 and 5.

Figure 4:
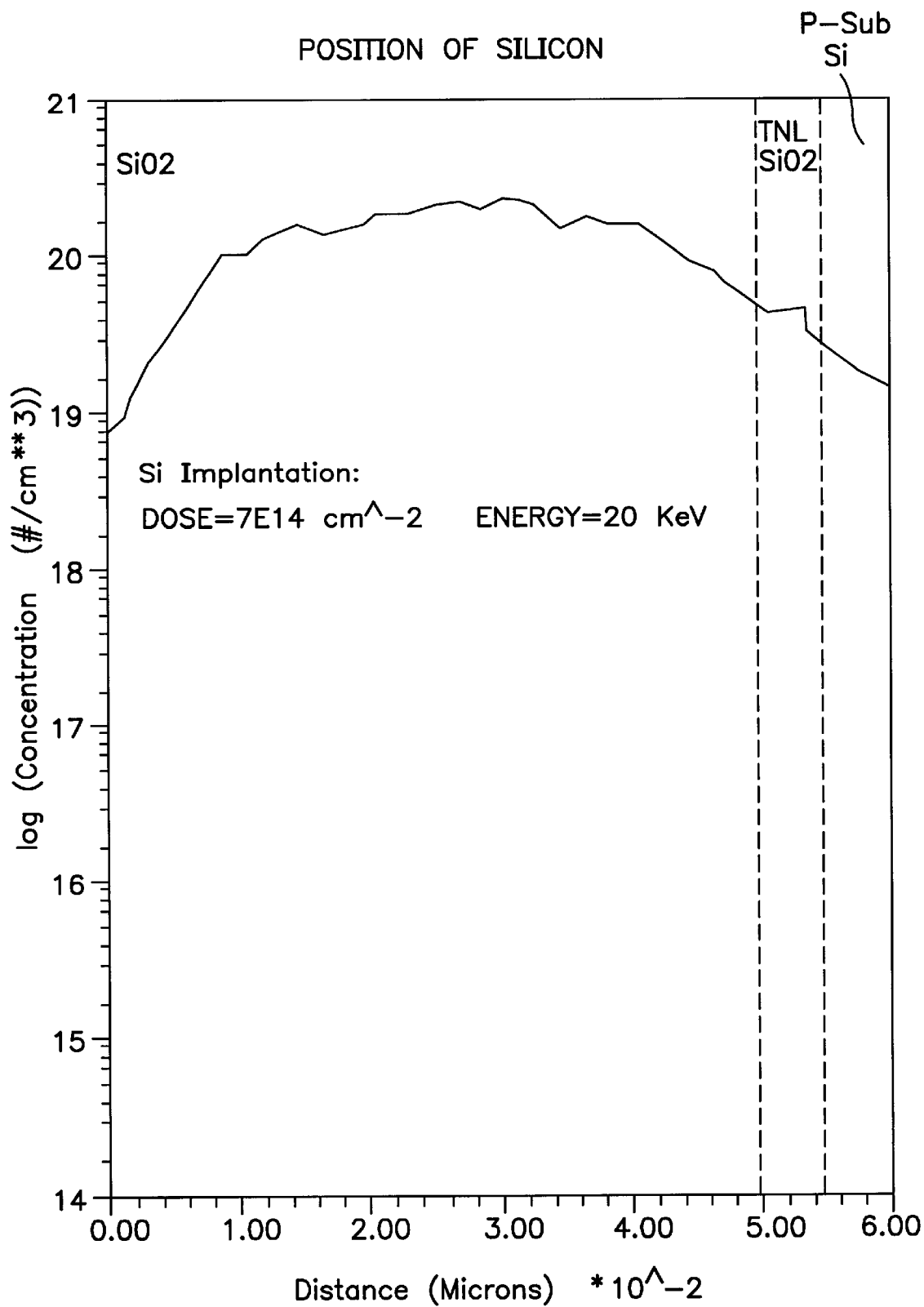
FIG. 4 is a graph showing the distribution of silicon ions within a thermal oxide layer after a silicon ion implantation.
Figure 5:
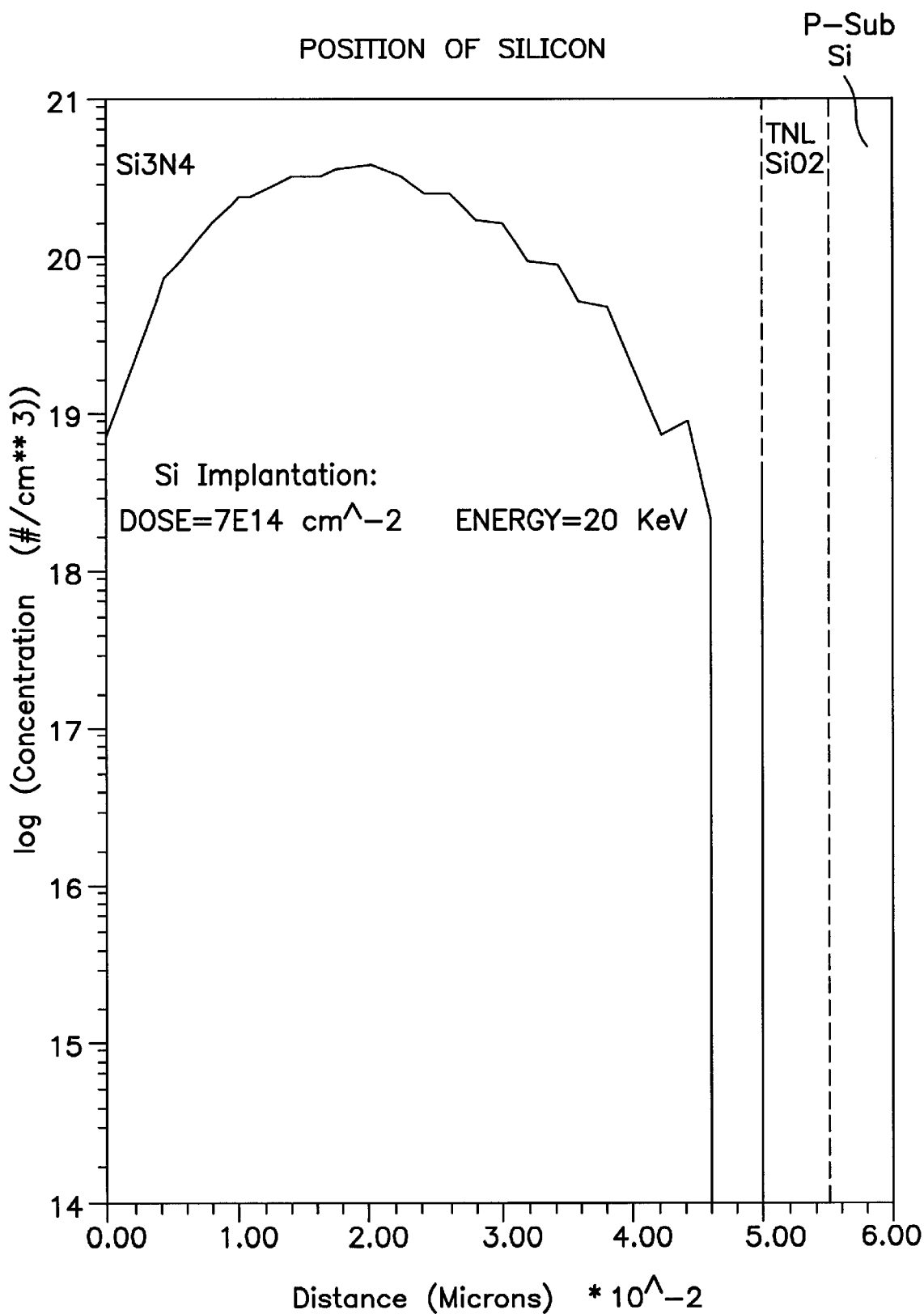
FIG. 5 is a graph showing the distribution of silicon ions within a composite layer composed of a silicon nitride layer and a thin thermal oxide layer after a silicon ion implantation.

FIG. 4 is a graph showing the distribution of silicon ions within a thermal oxide layer after silicon ions implantation. FIG. 5 is a graph showing the distribution of silicon ions within a composite layer composing of a silicon nitride layer and a thin thermal oxide layer after silicon ions implantation. It can be easily observed from FIG. 4 that the depth of implantation by implanting silicon ions into a thermal oxide layer is difficult to control. Hence, some of the silicon ions may penetrate into the silicon substrate.

On the other hand, when the silicon ions are implanted into a composite layer of silicon nitride and thin thermal oxide as shown in FIG. 5, the silicon ions can hardly reach the silicon substrate in the same operation condition. Hence, for a better control of both the thickness of the floating gate and the tunneling oxide layer, a silicon nitride layer is employed.

After the silicon ion implantation, the substrate is annealed to re-crystallize the implanted silicon atoms. The crystalline silicon crystals are the medium for storing the electric charges in this non-volatile memory device. Each of these small crystalline silicon crystals is separated from neighboring crystals by a small distance and is isolated from other crystalline silicon crystals by oxide or insulating material.

FIGS. 6A through 6D are schematic, cross-sectional views showing the progression of manufacturing steps in fabricating a non-volatile EPROM cell according to one preferred embodiment of this invention.

Figure 6A:
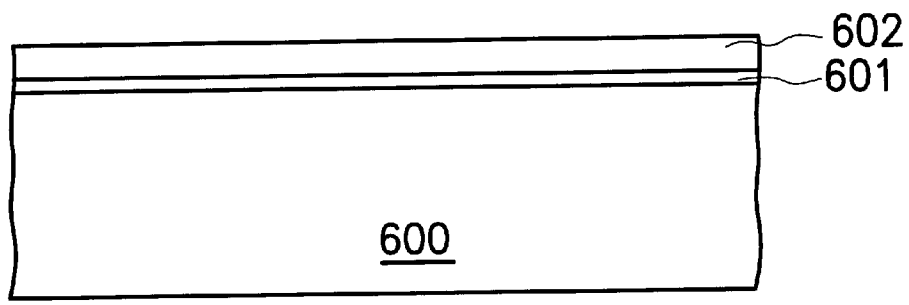
FIGS. 6A through 6D are schematic, cross-sectional views showing the progression of manufacturing steps in fabricating a non-volatile EPROM cell according to one preferred embodiment of this invention.

As shown in FIG. 6A, a thin thermal oxide layer (also known as tunneling oxide layer) 601 is formed over a silicon substrate 600. The thin thermal oxide layer has a thickness of between 20 Å to 50 Å. A silicon nitride layer ($Si_3N_4$) 602 having a thickness of about 500 Å is grown over the thin thermal oxide layer 601. Usually, a device isolation structure is formed in the substrate 600 before the thin thermal oxide layer 601 is formed. The device isolation structure includes a field oxide layer or a shallow trench isolation (STI), for example.

Figure 6B:
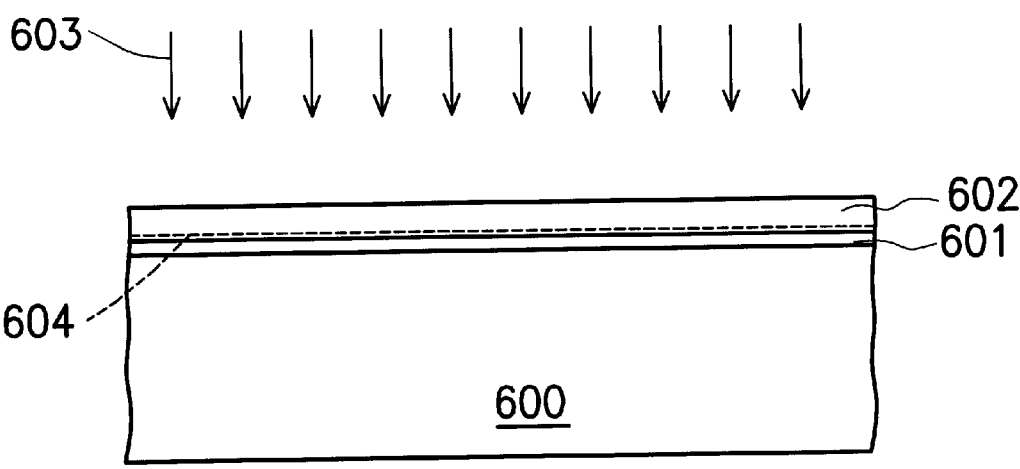

As shown in FIG. 6B, an ion implantation technique is used to implant silicon ions 603 into the silicon nitride layer 602 for forming a first polysilicon gate (distributed floating gate) in a subsequent operation. The implantation process is carried out using an energy level of about 20 KeV and a dosage of about $7 \times 10^{14}$ $cm^{-2}$. The foremost position of the implanted silicon ions can be controlled inside the silicon nitride layer 602 near the interface between the silicon nitride layer 602 and the thin thermal oxide layer 601.

Alternatively, the foremost position of the implanted silicon ions can be controlled inside the thin thermal oxide layer 601 and near the interface between the silicon nitride layer 602 and the thin thermal oxide layer 601. In FIG. 6B, the foremost position of the implanted silicon ions is shown to be inside the silicon nitride layer 602 at position 604.

Figure 6C:
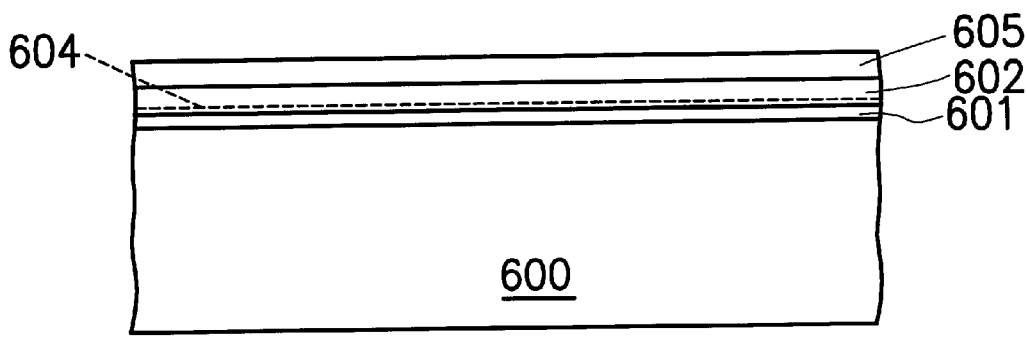

As shown in FIG. 6C, an oxide layer 605 having a thickness of about 350 Å is deposited over the silicon nitride layer 602 by a dry/wet oxidation method. The oxide layer 605 can be an insulation layer, a dielectric layer or a composite dielectric layer. If the oxide layer 605 is a composite dielectric layer, the composite layer can be an oxide/nitride/oxide (ONO) layer. In an ONO composite layer, the lower oxide preferably has a thickness of about 120 Å formed by a thermal oxidation method and the upper oxide preferably has a thickness of about 80 Å formed by a wet oxidation method, while the nitride layer has a thickness of about 150 Å.

Figure 6D:
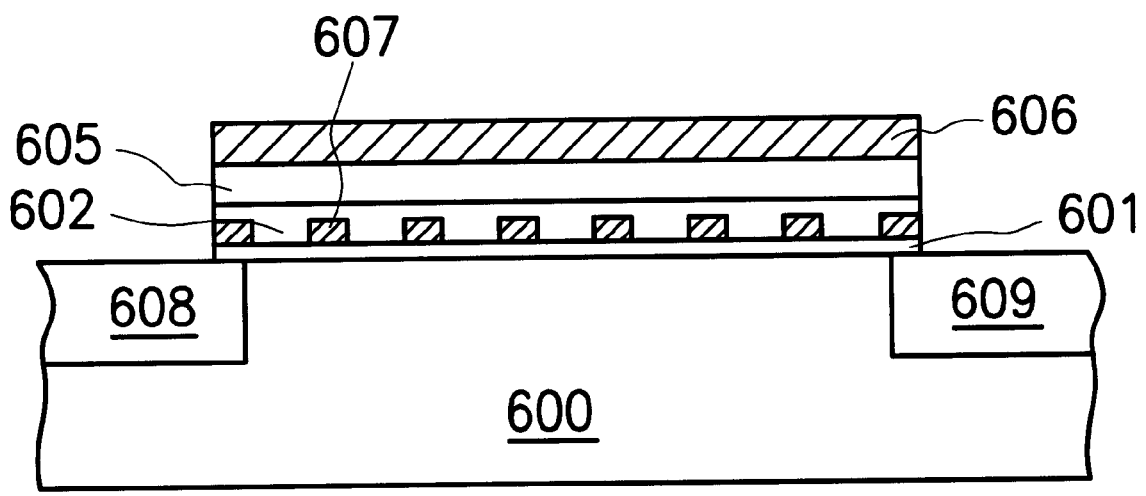

As shown in FIG. 6D, a second polysilicon gate 606 having a thickness of about 2000 Å is formed over the oxide layer 605. The second polysilicon gate 606 serves as a control gate for the memory device. Phosphorus ions can be doped into the second polysilicon layer 606 for lowering electrical resistance. The second polysilicon layer gate 605 can be formed by first forming a doped polysilicon layer over the oxide layer 605. Then, the polysilicon layer 606, the oxide layer 605, the silicon nitride layer 602 and the thin thermal oxide layer 601 are etched in sequence to create a pattern.

In the subsequent step, a second ion implantation is carried out to implant arsenic (As) ions into the substrate 600 to form N$^+$ source/drain regions 608 and 609. An energy level of about 55 KeV and a dosage of about $4.5 \times 10^{15}$ cm$^{-2}$ can be used in the second ion implantation. Since heating is required when the oxide layer 605 is grown and annealing is required after the N$^+$ source region 608 and drain region 609 are formed, the implanted silicon ions within the thin thermal oxide layer 601 and the silicon nitride layer 602 re-crystallize into small crystalline silicon crystals 607 forming a first polysilicon gate (the distributed floating gate). The crystalline silicon crystals 607 have a diameter ranging between about 10 Å and 100 Å and are separated from each other by a distance at least greater than 50 Å, as shown in FIG. 6D.

In the subsequent step, spacers, metal silicide layers, dielectric layers and interconnects are formed. Since conventional methods are used, detailed description of those operations is not repeated here. In the aforementioned description of the embodiment, the fabrication of an N-channel non-volatile EPROM cell is illustrated. Obviously, the invention is also applicable in fabricating a P-channel, non-volatile, EPROM cell.

Since the high-temperature processing operations are performed after the silicon ion implantation, a first polysilicon gate or a distributed floating gate as shown in FIGS. 2 and 6D is also formed. The advantages of storing electric charges in the small crystalline silicon crystals of this distributed floating gate structure includes:

1. Since the tunneling oxide layer is thinner, current density for writing data into the memory or erasing data from the memory is faster.

2. Since the required operating voltage is lower, less power is consumed by the memory IC.

3. Since the operating voltage is lower, oxide degradation caused by hot electrons during a memory-write or a memory-erase operation is small.

4. Since the floating gate is composed of a distribution of independent small crystalline silicon crystals, it is difficult for electric charges to migrate to the source/drain contact regions or substrate leading to a leakage current. Hence, a good data retention behavior can be achieved.

It be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming low power, high efficiency, non-volatile, erasable programmable memory cell structure, comprising the steps of:

providing a silicon substrate;

forming a thin thermal oxide layer over the substrate;

forming a silicon nitride layer over the thin thermal oxide layer;

implanting silicon ions into an interface between the thin thermal oxide layer and the silicon nitride layer;

forming a dielectric layer over the silicon nitride layer;

forming a second polysilicon gate layer over the dielectric layer, and then etching the second polysilicon gate layer, the dielectric layer, the silicon nitride layer and the thin thermal oxide layer to form a pattern; and performing a second ion implantation to form a source region and a drain region in the substrate, wherein the implanted silicon ions in the silicon nitride layer naturally form a plurality of floating-gate pieces due to a thermal effect in the subsequent steps with operation temperatures.

2. The method of claim 1, wherein the step of implanting silicon ions into the silicon nitride layer includes controlling the foremost position of the implanted silicon ions within the thin thermal oxide layer close to the interface between the thin thermal oxide layer and the silicon nitride layer.

3. The method of claim 1, wherein the step of implanting silicon ions into the silicon nitride layer includes controlling the foremost position of the implanted silicon ions within the silicon nitride layer close to the interface between the thin thermal oxide layer and the silicon nitride layer.

4. The method of claim 2, wherein after the step of implanting silicon ions into the silicon nitride layer, further includes subsequent high-temperature processing operation to form a plurality of independent crystalline silicon crystals within the thin thermal oxide layer and the silicon nitride layer with each crystal separated from other crystals by a small distance, and the assembly of distributed crystalline silicon crystal forms a first polysilicon gate layer.

5. The method of claim 4, wherein the crystalline silicon crystals of the first polysilicon gate layer have a diameter ranging from about 10 Å to 100 Å and the crystals are separated from each other by a distance roughly greater than 50 Å.

6. The method of claim 4, wherein the step of performing a high-temperature processing includes conducting an annealing operation.

7. The method of claim 2, wherein the step of forming the source/drain regions further includes an annealing operation that also transforms the implanted silicon ions within the thin thermal oxide layer and the silicon nitride layer into independent crystalline silicon crystals, each separated from the other crystals by a predetermined distance, and the assembly of distributed crystals constitutes a first polysilicon gate.

8. The method of claim 7, wherein each crystalline silicon crystal of the first polysilicon gate layer has a diameter ranging from about 10 Å to 100 Å and the crystals are separated from each other by a distance roughly greater than 50 Å.

9. The method of claim 2, wherein after the step of implanting silicon ions into the silicon nitride layer, further includes a subsequent high-temperature processing operation to form a plurality of independent crystalline silicon crystals within the silicon nitride layer with each crystal separated from the other crystals by a predetermined distance, and that the assembly of distributed crystalline silicon crystals forms a first polysilicon gate layer.

10. The method of claim 9, wherein each crystalline silicon crystal of the first polysilicon gate layer has a diameter ranging from about 10 Å to 100 Å and the crystals are separated from each other by a distance roughly greater than 50 Å.

11. The method of claim 9, wherein the step of performing a high-temperature process includes conducting an annealing operation.

12. The method of claim 3, wherein the step of forming the source/drain regions further includes an annealing operation that also transforms the implanted silicon ions within the silicon nitride layer into independent crystalline silicon crystals, each separated from the other crystals by a predetermined distance, and the assembly of distributed crystals constitutes a first polysilicon gate.

13. The method of claim 12, wherein each crystalline silicon crystal of the first polysilicon gate layer has a diameter ranging from about 10 Å to 100 Å and the crystals are separated from each other by a distance roughly greater than 50 Å.

14. The method of claim 1, wherein germanium ions can be implanted into the silicon nitride layer instead of implanting silicon ions into the silicon nitride layer.

15. The method of claim 1, wherein the thin thermal oxide layer has a thickness roughly between 20 Å and 50 Å.

16. The method of claim 1, wherein the silicon nitride layer has a thickness of about 500 Å.

17. The method of claim 1, wherein the step of implanting silicon ions into the silicon nitride layer includes using an energy level of about 20 KeV and a dosage of about $7\times10^{14}$ cm$^{-2}$.

18. The method of claim 1, wherein the step of forming the dielectric layer includes growing an oxide layer.

19. The method of claim 18, wherein the step of growing the oxide layer includes using a dry/wet oxidation method to form a layer of oxide having a thickness of about 350 Å.

20. The method of claim 1, wherein the step of forming the dielectric layer includes depositing two or more dielectric layers to form a composite layer.

21. The method of claim 20, wherein the step of forming the composite layer includes depositing a first oxide layer, a nitride layer and a second oxide layer in sequence such that the first oxide layer has a thickness of about 120 Å formed by a thermal oxidation, the silicon nitride layer has a thickness of about 150 Å and the second oxide layer has a thickness of about 80 Å formed by a wet oxidation.

22. The method of claim 1, wherein the step of forming the second polysilicon gate layer further includes doping the polysilicon layer for lowering its electrical resistance.

23. The method of claim 1, wherein the step of forming the source region and the drain region includes implanting ions at an energy level of about 55 KeV and a dosage of about $4.5\times10^{15}$ cm$^{-2}$.

24. The method of claim 23, wherein the step of implanting ions into the substrate to form source/drain regions includes implanting arsenic (As) ions to form N-channel, non-volatile memory.

25. The method of claim 23, wherein the step of implanting ions into the substrate to form source/drain regions includes implanting boron (B) ions to form the P-channel, non-volatile memory.

26. A method for forming non-volatile, erasable programmable memory, comprising the steps of:

providing a silicon substrate having an oxide layer formed thereon;

forming a silicon nitride layer on the oxide layer;

performing a first ion implantation process to implant a plurality of silicon ions into the interface between the oxide layer and the silicon nitride layer;

performing a thermal oxidation to form a dielectric layer over the silicon nitride layer, wherein portions of the silicon ions crystallize into a plurality of floating-gate pieces in the silicon nitride layer under a relatively high temperature in the thermal oxidation;

forming a polysilicon layer over the dielectric layer;

patterning the polysilicon layer, the dielectric layer, the silicon nitride layer and the oxide layer to form a gate structure; and performing a second ion implantation and a drive-in process to form a source region and a drain region in the substrate adjacent to a portion of the substrate beneath the gate structure, wherein the remaining silicon ions in the silicon nitride layer crystallize into the floating-gate pieces under a high temperature in the drive-in process.

* * * * *